United States Patent
Hsieh et al.

[11] Patent Number: 6,066,541
[45] Date of Patent: May 23, 2000

[54] METHOD FOR FABRICATING A CYLINDRICAL CAPACITOR

[75] Inventors: Ming-Teng Hsieh, Pan-Chiao; Tsu-An Lin, Taichung; Pei-Ying Lee, Taipei Hsien; Hsing-Chuan Tsai, Taipei, all of Taiwan

[73] Assignee: Nanya Technology Corporation, Taiwan

[21] Appl. No.: 09/066,566

[22] Filed: Apr. 27, 1998

[30] Foreign Application Priority Data

Jan. 20, 1998 [TW] Taiwan ................................. 87100746

[51] Int. Cl.[7] .................................................. H01L 21/20
[52] U.S. Cl. ........................... 438/397; 438/253; 438/396
[58] Field of Search .................... 438/396, 398, 438/253, 397

[56] References Cited

U.S. PATENT DOCUMENTS

| | | | |
|---|---|---|---|
| 5,518,948 | 5/1996 | Walker | 438/396 |
| 5,545,585 | 8/1996 | Wang et al. | 438/397 |
| 5,597,756 | 1/1997 | Fazan et al. | 438/398 |
| 5,700,709 | 12/1997 | Park et al. | 438/397 |
| 5,728,617 | 3/1998 | Tseng | 438/253 |
| 5,811,332 | 9/1998 | Chao | 438/253 |
| 5,837,594 | 11/1998 | Honma et al. | 438/396 |
| 5,902,126 | 5/1999 | Hong et al. | 438/396 |
| 5,913,129 | 6/1999 | Wu et al. | 438/398 |
| 5,930,623 | 7/1999 | Wu | 438/253 |

OTHER PUBLICATIONS

Wolf, "Silicon Processing for the VLSI Era, Volume 2: Process Integration", Lattice Press, p. 598, 1990.

*Primary Examiner*—Charles Bowers
*Assistant Examiner*—Evan Pert
*Attorney, Agent, or Firm*—Michael D. Bednarek; Crowell & Moring LLP

[57] ABSTRACT

A method for fabricating a cylindrical capacitor is provided. This invention uses a composite structure composed of stacked barrier/scarificing/mask layers to prevent the contact plug of the capacitor from being attacked by wet etchants. An insulating layer is formed over a substrate having a source region, a drain region, and a gate electrode. Then a barrier layer, a sacrificing layer and a mask layer are sequentially formed over the insulating layer. Next, a contact hole is formed over the source region and spacers are formed on the sidewalls of the contact hole. After a storage electrode of the capacitor is formed and exposed portions of the mask layer are removed, the sacrificing layer is isotropically etched using the spacers and the barrier layer as stopping layers. Thereafter, a capacitor dielectric layer and an opposite electrode are formed over the storage electrode thereby completing the capacitor.

23 Claims, 7 Drawing Sheets

METHOD FOR FABRICATING A CYLINDRICAL CAPACITOR

BACKGROUND OF THE INVENTION

1. Field of the Invention

This invention relates in general to the fabrication of semiconductor integrated circuits (ICs), and more particularly to a method for fabricating a cylindrical capacitor of a DRAM cell.

2. Description of the Related Arts

The development of the semiconductor industry has always followed that of the Dynamic Random Access Memory (DRAM) technology. A conventional DRAM cell consists of a transistor and a capacitor. The source of the transistor is connected to a corresponding bit line, the drain is connected to a storage electrode of the capacitor, and the gate is connected to a corresponding word line. An opposite electrode of the capacitor is biased with a constant voltage source. A dielectric layer is arranged between the storage electrode and the opposite electrode. As known to those skilled in the art, the storage capacitor is provided for data storage. Therefore, a large capacitance is required for the capacitor to prevent data loss and to lower the refresh rate.

For a conventional DRAM of less than 1 MB capacity, a two-dimensional capacitor structure is utilized for data storage. This capacitor structure is well known as a planar-type capacitor. However, in order to provide a capacitance large enough for data storage, the planar-type capacitor occupies a very large base area. This structure cannot therefore be applied in a high-density DRAM process. Therefore, stacked capacitors having a three-dimensional structure have been suggested to improve cell capacitance. Such stacked capacitors include, for example double stacked, fin structured, cylindrical, spread-stacked, and box structured capacitors.

The conventional fabrication steps of a cylindrical capacitor for a DRAM cell will be described in accompaniment with the drawing of FIG. 1A through FIG. 1G. Referring to FIG. 1A, a field oxide 12 is formed on a semiconductor substrate 10 for defining active regions and isolation regions. Then a MOSFET transistor is formed over the active region. The transistor can comprise: a gate oxide layer 14, gate electrode 16, source 24A, and drain 24B. The gate electrode 16 is surrounded by insulating spacers 18.

As shown in FIG. 1A, the transistor is covered by a first insulating layer 30, for example a borophosphosilicate glass (BPSG) layer, which is etched to form a contact hole (not shown in the figure) to expose the drain region 24B of the transistor. Then a first conductive layer is formed over the first insulating layer and fills the contact hole, thereby electrically connecting the drain region 24B. This conductive layer is patterned to form a bit line of the memory device (not shown in the figure). Then a second insulating layer 32, for example a BPSG layer, is deposited over the first insulating layer 30 and the exposed bit line. After the second insulating layer is planarized by reflow, a first silicon nitride layer 34 is deposited on it as a hard mask. The first nitride layer 34 preferably has a thickness of about 1500 Å.

Referring to FIG. 1B, as a beginning step in forming electrode contacts to the source region, an opening 35 is formed over the source 24A through the first nitride layer 34. Then a second silicon nitride layer 36 is formed over the first nitride layer 34 and the second insulating layer 32, which is then anisotropically etched to form nitride spacers 36A on the sidewalls of the opening 35.

Referring to FIG. 1C, using the first nitride layer 34 and the nitride spacers 36A as an etch mask, a contact hole 37 is etched through the first and the second insulating layers 30, 32 exposing the sources 24A. The contact hole 37 can be formed by using anisotropic etching techniques such as reactive ion beam (RIE) etching. The sidewall spacers 36A allow the contact hole 37 to be more precisely defined thus allowing the capacitor to be further miniaturized.

Referring to FIG. 1D, oxide spacers 38 are formed on the sidewalls of the contact hole to prevent shorting between the capacitor and the word lines. The oxide spacers are fabricated by forming a conformal silicon oxide layer using low pressure chemical vapor deposition (LPCVD). Then the conformal silicon oxide layer is anisotropically etched. The conformal silicon oxide layer preferably has a thickness of 300 Å. Next, a conductive layer 40 is formed over the first nitride layer 34 and fills the hole 37 thus forming an electrical connection to the contact region. The conductive layer 40 can be a doped polysilicon layer.

Referring to FIG. 1E, the conductive layer 40 is etched back to the first nitride layer 34 thus forming a conductive polysilicon plug 40A; or alternatively, the undesired portions of the conductive layer can be removed by chemical mechanical polishing (CMP) using the first nitride layer 34 as a stopping layer.

Thereafter, a conductive polysilicon layer is deposited over the polysilicon plug 40A and the first nitride layer 34, which is then patterned to form grooves that define areas for individual cell units. As shown in FIG. 1F, grooves 41 are formed between the adjacent cells thereby forming polysilicon islands 42 which connect to the aforementioned polysilicon plug 40A.

In order to increase the capacitance of the DRAM capacitor, the first nitride layer 34 is then isotropically etched through the groove 41 to thereby expose the bottom surface of the polysilicon islands 42. This isotropic etch is generally realized by wet etching techniques. However, since the wet etchant for silicon nitride attacks silicon dioxide as well, the oxide spacers 38 could be encroached or even broken through by the wet etchant, therefore damaging the polysilicon plug 40A.

Accordingly, it is necessary to develop methods of manufacturing cylindrical capacitors that can prevent the contact plug from being damaged by the wet etchant.

SUMMARY OF THE INVENTION

It is an object of the invention to provide a method for fabricating a cylindrical capacitor, which insures the polysilicon plug to be immune from the attack of etching solutions when proceeding with the isotropic etch as illustrated in FIG. 1F.

To accomplish the aforementioned objective, the present invention provides a method for fabricating a capacitor of a semiconductor memory device, which is characterized in that the conventional mask layer (e.g. the first nitride layer 34) is replaced by a composite structure consisting of stacked mask/sacrificing/barrier layers.

The method according to the invention includes the steps of: (a) forming an insulating layer over a substrate having a source region, a drain region, and a gate electrode; (b) forming sequentially a barrier layer, a sacrificing layer and a mask layer over the insulating layer; (c) forming a contact hole through the mask layer, the sacrificing layer, the barrier layer, and the insulating layer exposing the source region; (d) forming spacers on the sidewalls of the contact hole; (e) forming a first conductive layer over the mask layer and filling the contact hole thereby forming an electrical connection to the source region; (f) patterning the first conductive layer to form a storage electrode of the capacitor, the patterning exposing portions of the mask layer; (g) removing the exposed portions of the mask layer; (h) isotropically etching the sacrificing layer using the spacers and the barrier layer as stopping layers; (i) forming a dielectric layer over the storage electrode; and (j) forming a second conductive layer as an opposite electrode over the dielectric layer thereby completing the capacitor.

According to the preferred embodiment of the inventions, the aforementioned mask layer is a silicon nitride layer, the sacrificing layer is a silicon oxide layer, and the barrier layer is a silicon nitride layer. In other words, the conventional nitride single layer is replaced by nitride/oxide/nitride multiple layers.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1A:
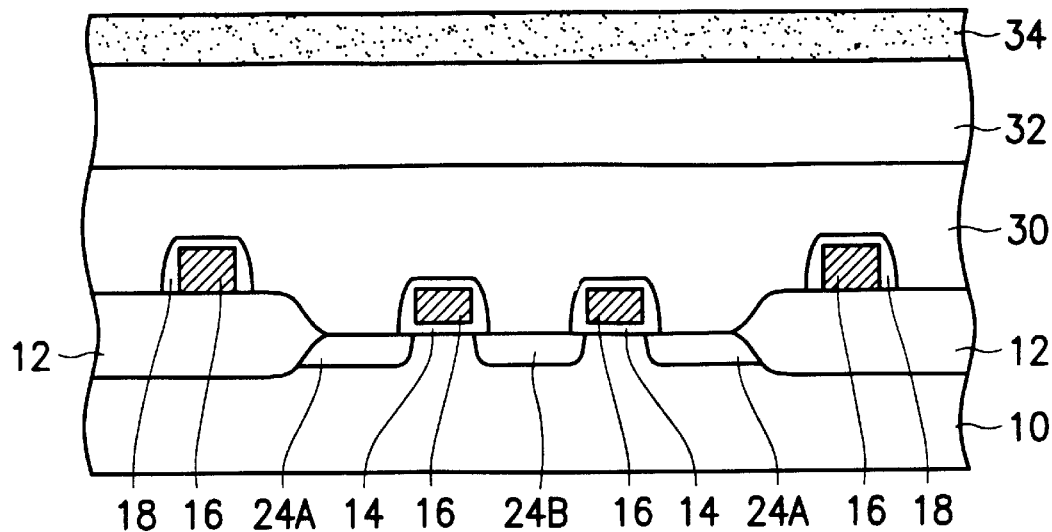
FIGS. 1A through 1F are cross-sectional views for illustrating the conventional fabrication steps of a cylindrical capacitor.
Figure 1B:
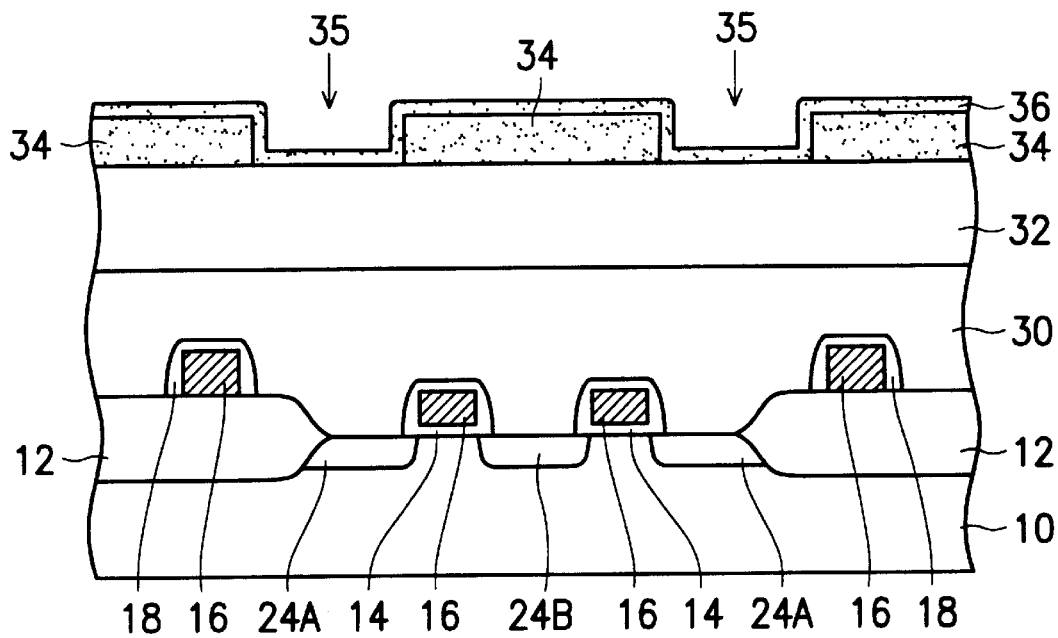
Figure 1C:
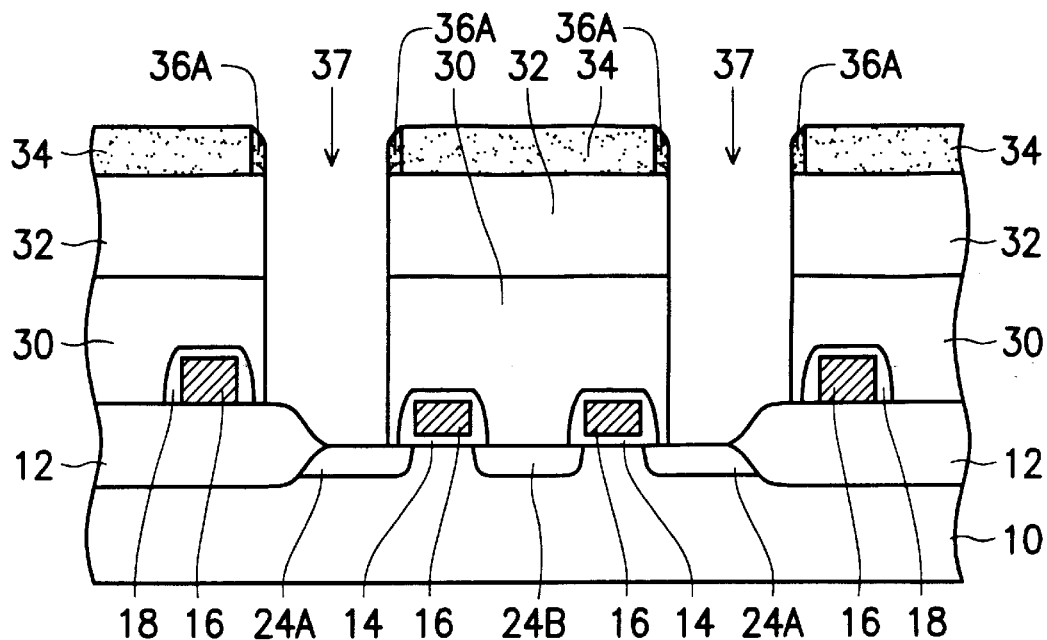
Figure 1D:
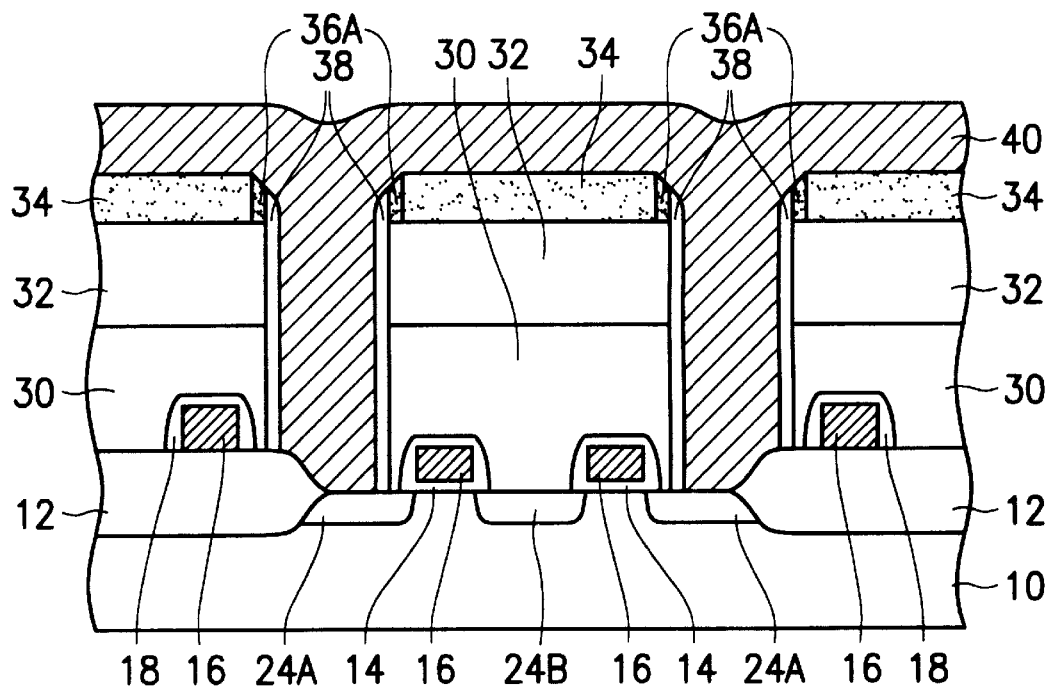
Figure 1E:
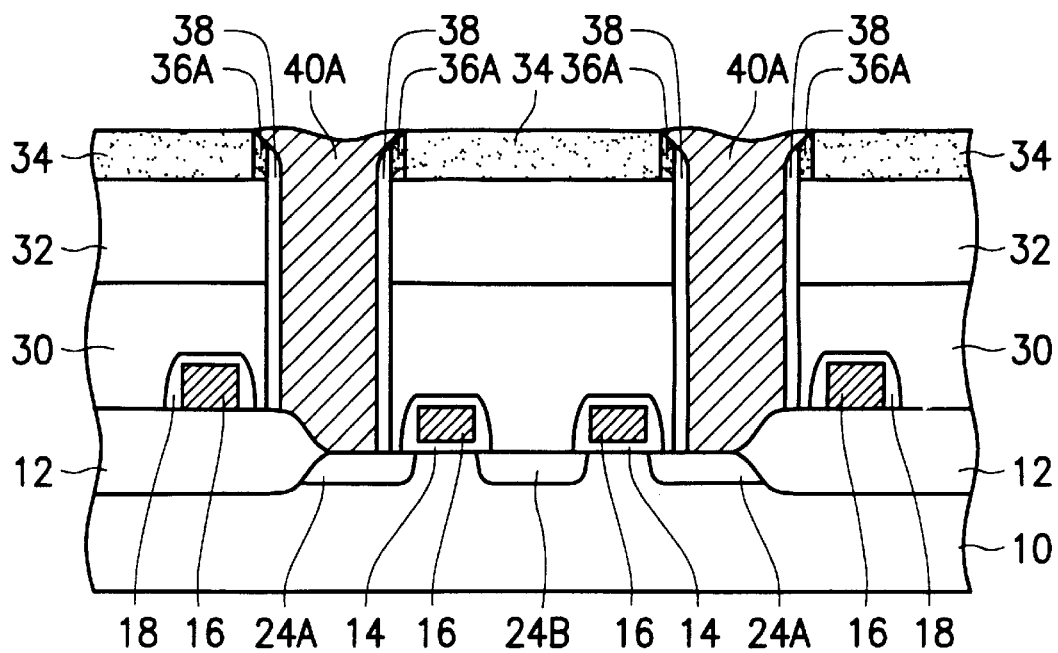
Figure 1F:
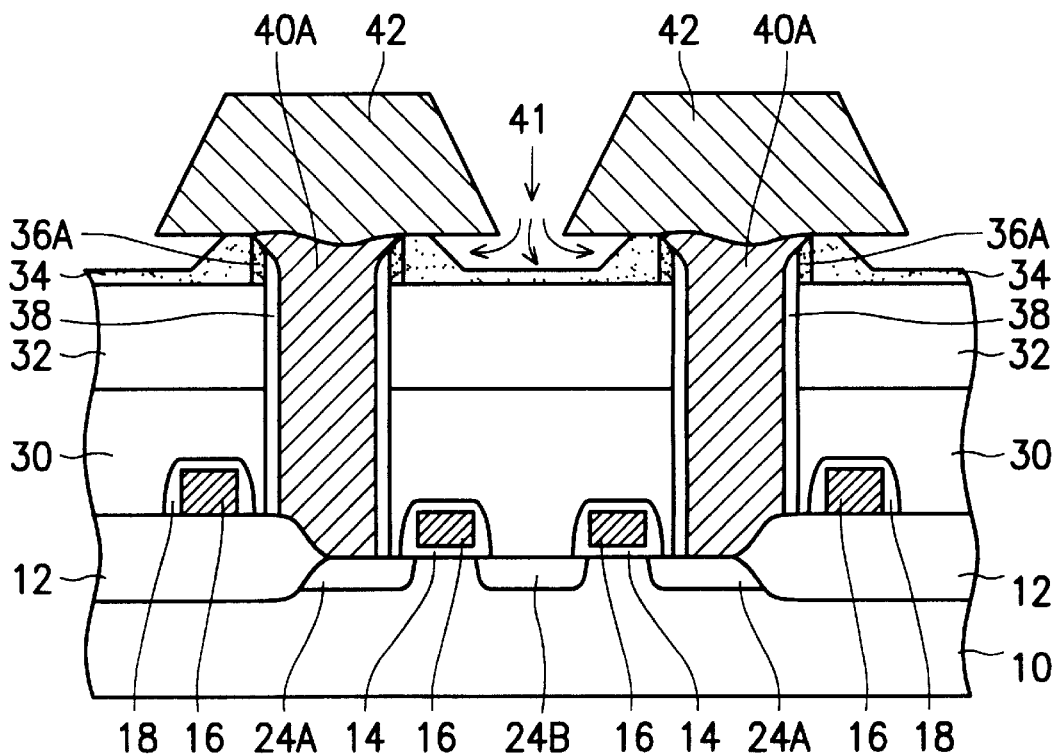
Figure 2A:
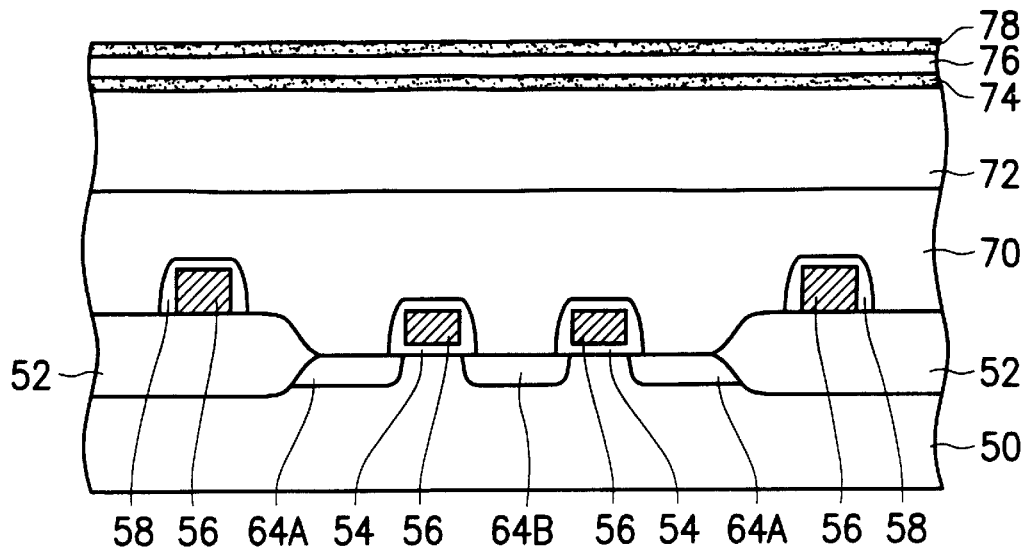
FIGS. 2A through 2G are cross-sectional views for illustrating the method for manufacturing the cylindrical capacitor of a semiconductor memory device according to the present invention.

Now in keeping with the objective of this invention, the method for fabricating a DRAM cylindrical capacitor is described in detail. The general overall sequence of fabrication steps is shown through FIGS. 2A through 2G. Referring to FIG. 2A, it is assumed that a MOSFET is formed on a silicon substrate 50 upon which the capacitor according to the present invention will be formed. The substrate can have active regions including an array of memory cells, each of the memory cells having a MOSFET transistor. The active region of the transistor can be defined by field oxide layers 52. The transistor can comprise: a gate oxide layer 54, source 64A, drain 64B, and gate electrode 56 which is surrounded by insulating spacers 58.

Still referring to FIG. 2A, the transistor is covered by a first insulating layer 70, for example a borophosphosilicate glass (BPSG) layer, which is etched to form a contact hole (not shown in the figure) to expose the drain region 64B of the transistor. Then a first conductive layer is formed over the first insulating layer and fills the contact hole, thereby electrically connecting the drain region 64B. This conductive layer is patterned to form a bit line of the memory device (not shown in the figure). Then a second insulating layer 72, for example a BPSG layer, is deposited over the first insulating layer 70 and the exposed bit line. After the second insulating layer is planarized by reflow, a barrier layer 74, a sacrificing layer 76 and a mask layer 78 are sequentially deposited over the second insulating layer. The barrier layer 74 is preferably formed of silicon nitride and preferably has a thickness of about 300 Å. The sacrificing layer 76 is preferably formed of silicon dioxide and preferably has a thickness of about 1000 Å. The mask layer 78 is preferably formed of silicon nitride and preferably has a thickness of about 700 Å.

Figure 2B:
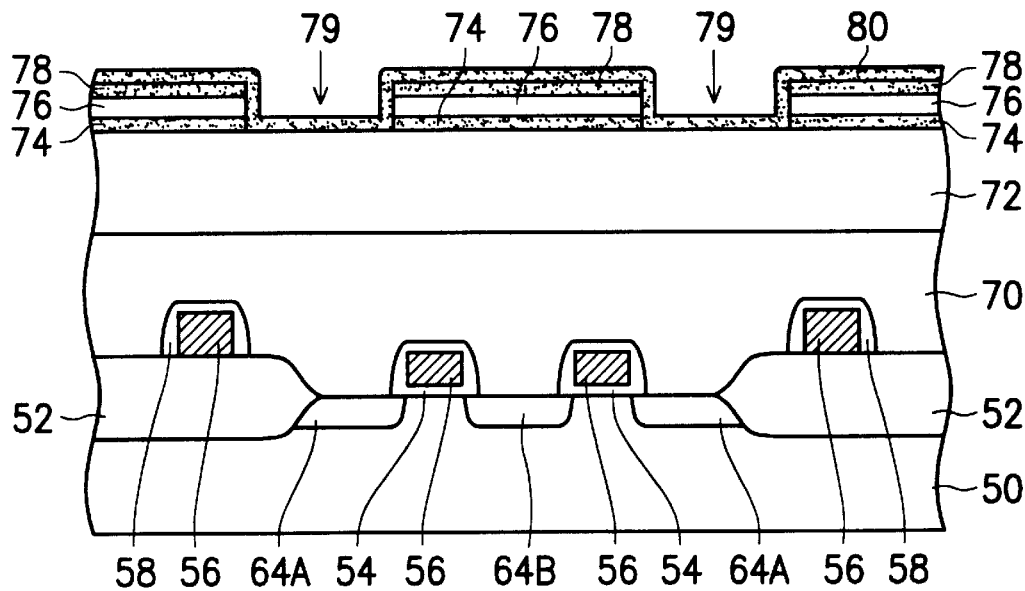

Referring to FIG. 2B, as a beginning step in forming electrode contacts to the source region, an opening 79 is formed over the source 64A through the mask layer 78, the sacrificing layer 76, and the barrier layer 74 exposing portions of the second insulating layer 72. Then a silicon nitride layer 80 is formed over the mask layer 78 and the second insulating layer 72, which is then anisotropically etched to form first dielectric (nitride) spacers 80A on the sidewalls of the opening 79. The nitride layer 80 preferably has a thickness of 500 Å.

Figure 2C:
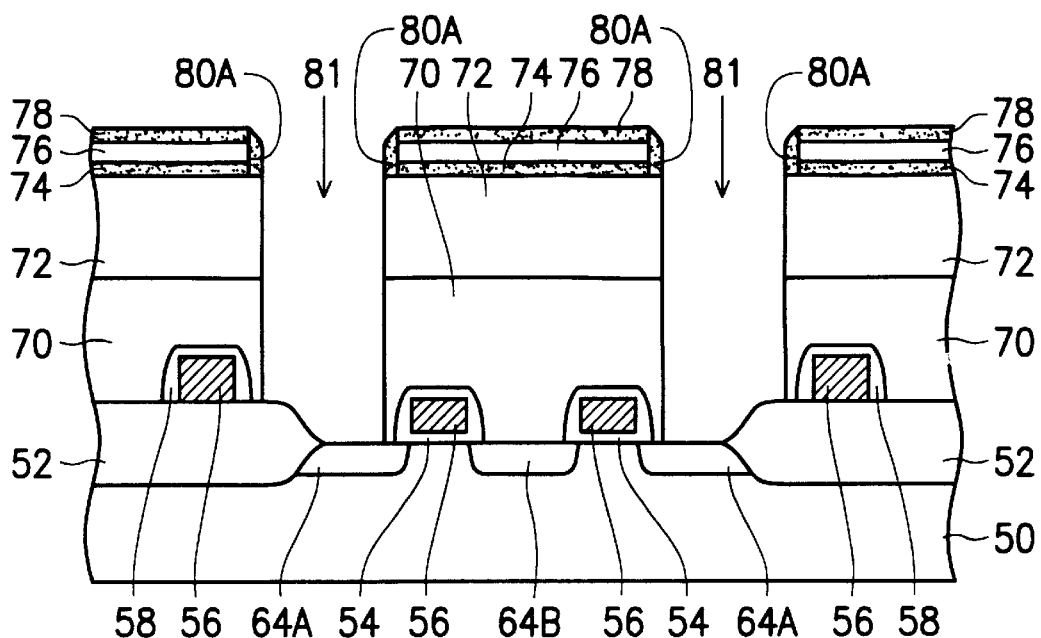

Using the mask layer 78 and the first (nitride) spacers 80A as an etch mask, a contact hole 81 is etched through the first and the second insulating layers 70, 72 over the sources 64A as shown in FIG. 2C. The contact hole 81 can be formed by using anisotropic etching techniques such as reactive ion beam (RIE) etching. The sidewall spacers 80A allow the contact hole 81 to be more precisely defined thus allowing the capacitor to be further miniaturized.

Figure 2D:
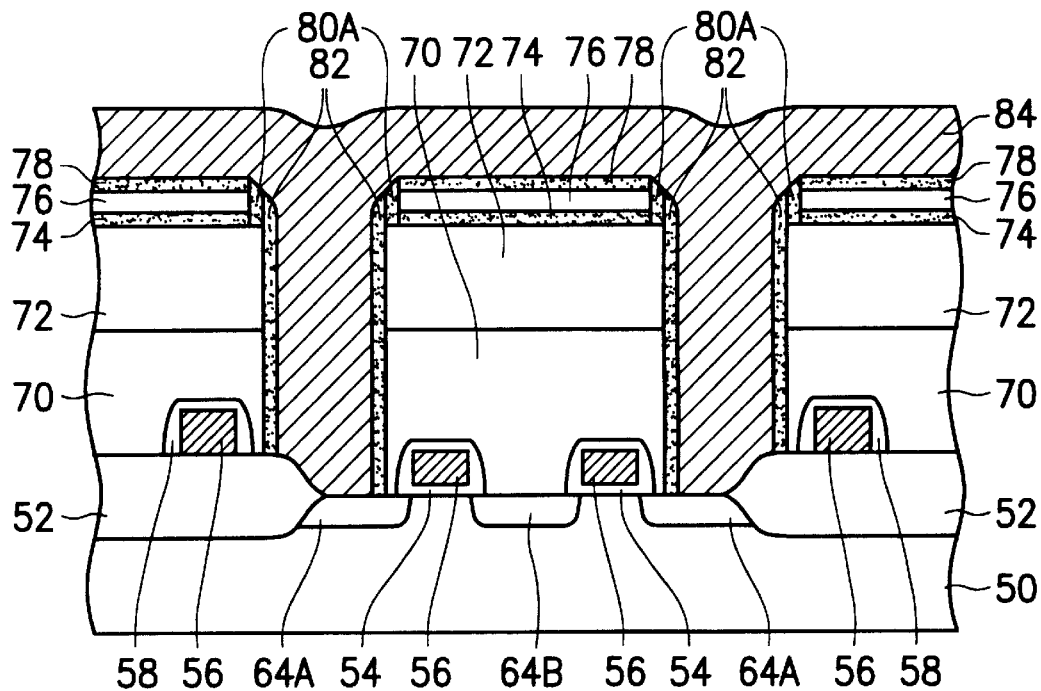

As shown in FIG. 2D, second dielectric spacers 82 are formed on the sidewalls of the contact hole to prevent shorting between the capacitor and the word lines. The second dielectric spacers can be formed by depositing a conformal silicon nitride layer and anisotropically etching back. The conformal silicon nitride layer can be formed by LPCVD, preferably having a thickness of 300 Å. After this, a conductive layer 84 is formed over the mask layer 78 and fills the hole 81 thus forming an electrical connection to the source region. The conductive layer 84 is preferably formed of doped polysilicon.

Figure 2E:
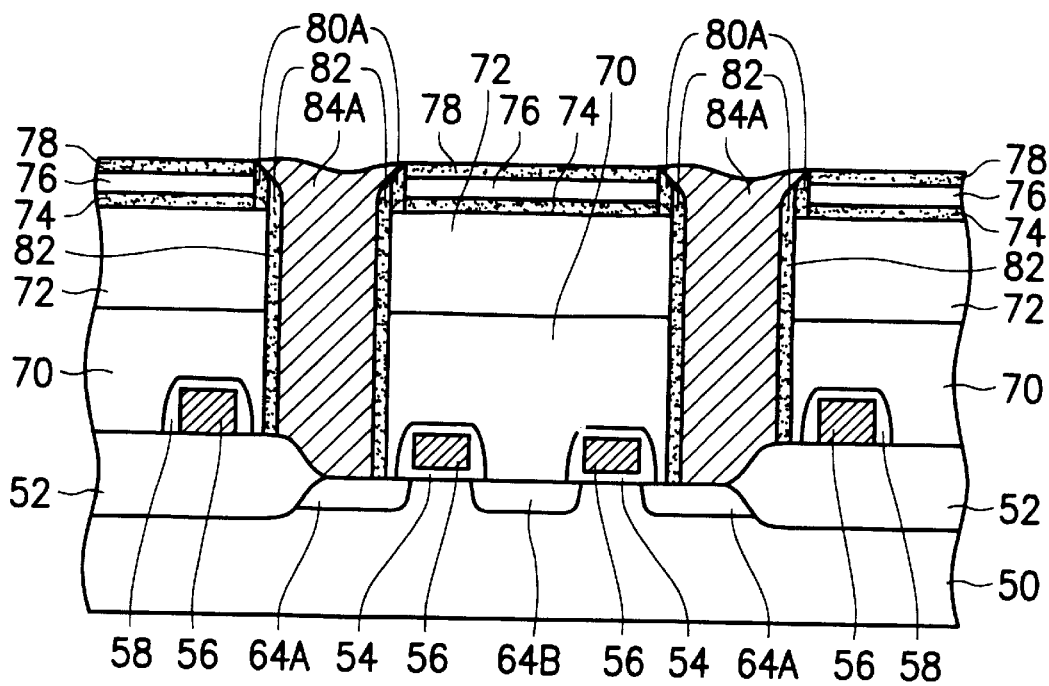

Referring to FIG. 2E, the conductive layer 84 is etched back to the mask layer 78 thus forming a conductive polysilicon plug 84A; or in the alternative, the undesired portion of the conductive layer can be removed by CMP using the mask (e.g. nitride) layer 78 as a stopping layer.

Figure 2F:
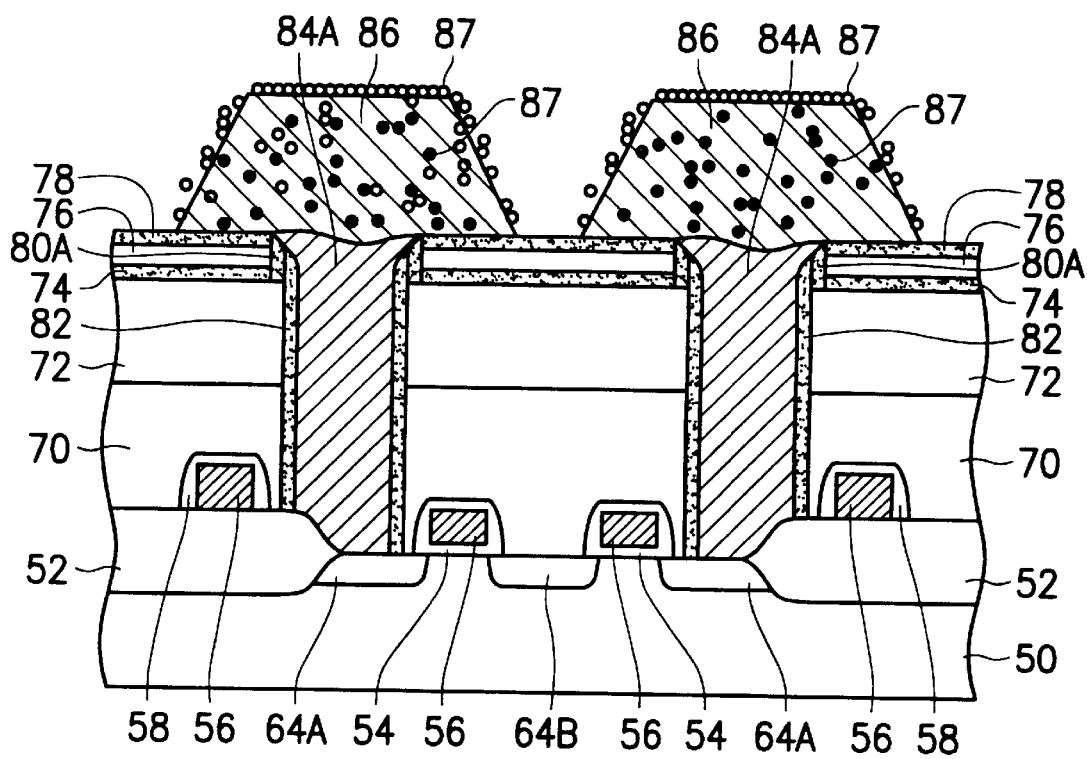

Referring to FIG. 2F, a conductive polysilicon layer preferably having a thickness of about 6000 Å is deposited over the polysilicon plug 84A and the mask layer 78, which is then patterned to give a storage electrode including the polysilicon islands 86 and the polysilicon plug 84A. To increase the electrode area, a plurality of hemispherical silicon grains (HSG) 87 can be formed over the exposed storage electrode thereby increasing the capacitance.

Figure 2G:
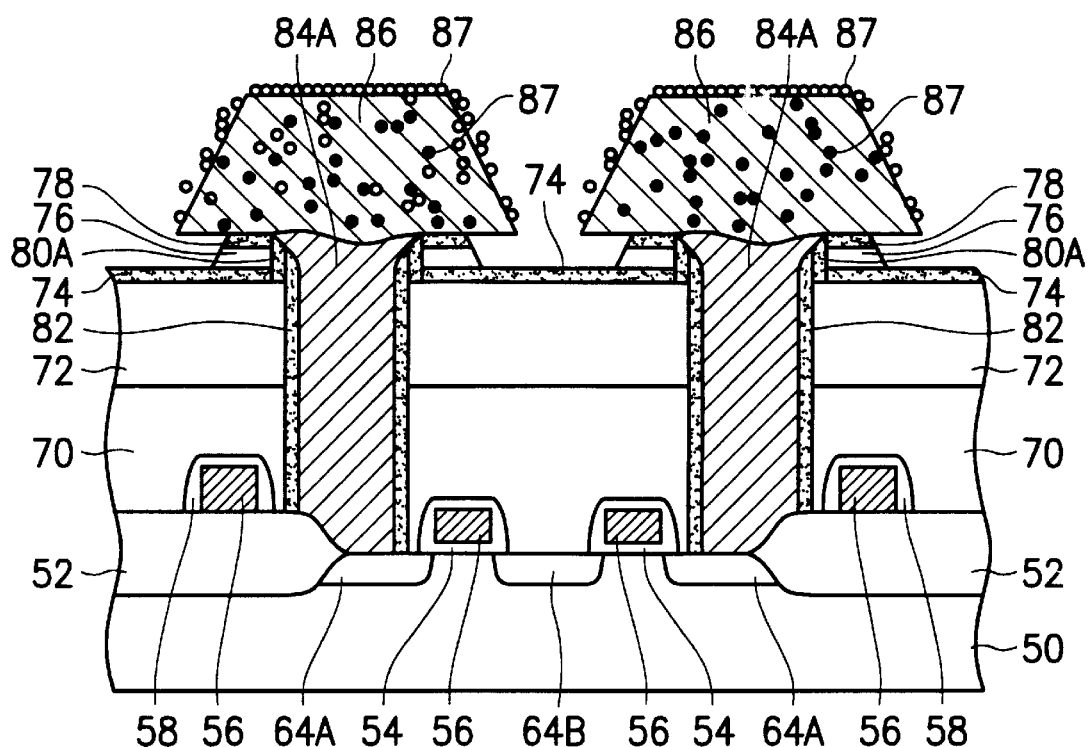

Referring to FIG. 2G, after removing the exposed mask layer 78, the underlying sacrificing (oxide) layer 76 is isotropically etched by wet etching. Since for an oxide wet etchant, its etch rate to silicon nitride is much slower than that to silicon dioxide, the barrier (nitride) layer 74 and the first dielectric (nitride) spacers can act as stopping layers to prevent the polysilicon plug 84A from being attacked. It is noted that, without departing from the spirit and scope of the invention, the capacitor contact hole 81 also can be etched directly along the opening 79 without the first dielectric spacers 80A (see FIG. 2C). In such circumstances, the second dielectric (nitride) spacers 82 can act as etching stop to protect the polysilicon plug 84A as well.

Subsequently, a capacitor dielectric layer is formed over the exposed storage electrode. The dielectric layer can be formed of silicon dioxide, silicon nitride, oxynitride, $Ta_2O_5$, or ferroelectric material. For example, the dielectric layer can be composed of oxide/nitride/oxide (ONO) structure. The capacitor dielectric layer is then covered by a conductive layer which is formed by, for example, depositing polysilicon by CVD to a thickness of about 1500 Å, and then doped with arsenic ions to improve the conductivity. The conductive layer is patterned to be an opposed electrode of capacitor thereby completing the cylindrical capacitor of the invention.

While the invention has been particularly shown and described with reference to the preferred embodiment

What is claimed is:

1. A method for fabricating a cylindrical capacitor on a substrate having a source region, a drain region, and a gate electrode, comprising the steps of:

(a) forming an insulating layer over surface of said substrate;

(b) forming sequentially a barrier layer, a sacrificing layer and a mask layer over said insulating layer;

(c) forming a contact hole through said mask layer, said sacrificing layer, said barrier layer, and said insulating layer exposing said source region;

(d) forming spacers on the sidewalls of said contact hole;

(e) forming a first conductive layer over said mask layer and filling said contact hole thereby forming an electrical connection to said source region;

(f) patterning said first conductive layer to form a storage electrode of said capacitor, said patterning forming exposed portions and unexposed portions of said mask layer;

(g) removing said exposed portions of said mask layer;

(h) isotropically etching said sacrificing layer using said unexposed portions, said spacers and said barrier layer as stopping layers;

(i) forming a dielectric layer over said storage electrode; and (j) forming a second conductive layer as an opposite electrode over said dielectric layer thereby completing said capacitor.

2. The method for fabricating a cylindrical capacitor as claimed in claim 1, wherein said insulating layer includes at least one BPSG layer in which a bit line is formed.

3. The method for fabricating a cylindrical capacitor as claimed in claim 1, wherein said sacrificing layer is formed of silicon dioxide.

4. The method for fabricating a cylindrical capacitor as claimed in claim 3, wherein said barrier layer is formed of silicon nitride.

5. The method for fabricating a cylindrical capacitor as claimed in claim 4, wherein said mask layer is formed of silicon nitride.

6. The method for fabricating a cylindrical capacitor as claimed in claim 5, wherein said barrier layer has a thickness of about 300 Å, said sacrificing layer has a thickness of about 1000 Å, and said mask layer has a thickness of about 700 Å.

7. The method for fabricating a cylindrical capacitor as claimed in claim 5, wherein said spacers are formed of silicon nitride.

8. The method for fabricating a cylindrical capacitor as claimed in claim 7, wherein said spacers are formed by low-pressure chemical vapor deposition and have a width of about 300 Å.

9. The method for fabricating a cylindrical capacitor as claimed in claim 1, wherein said first conductive layer is formed by the following steps of:

forming a polysilicon plug in said contact hole to electrically connect to the source region; and forming a polysilicon layer over said polysilicon plug nd said mask layer.

10. The method for fabricating a cylindrical capacitor as claimed in claim 1, wherein step (f) further comprises forming a plurality of hemispherical silicon grains over the exposed surface of said storage electrode.

11. The method for fabricating a cylindrical capacitor as claimed in claim 1, wherein said dielectric layer is formed of a material selected from the group consisting of silicon dioxide, silicon nitride, oxynitride, $Ta_2O_5$, and ferroelectric material.

12. A method for fabricating a cylindrical capacitor on a substrate having a source region, a drain region, and a gate electrode, comprising the steps of:

(a) forming an insulating layer over surface of said substrate;

(b) forming sequentially a barrier layer, a sacrificing layer and a mask layer over said insulating layer;

(c) forming an opening through said mask layer, said sacrificing layer, and said barrier layer exposing said insulating layer;

(d) forming first spacers on the sidewalls of said opening;

(e) anisotropically etching said exposed insulating layer using said mask layer and said first spacers as a mask, thereby forming a contact hole that exposes said source region;

(f) forming second spacers on the sidewalls of said contact hole;

(g) forming a first conductive layer over said mask layer and filling said contact hole thereby forming an electrical connection to said source region;

(h) patterning said first conductive layer to form a storage electrode of said capacitor, said patterning forming exposed portions and unexposed portions of said mask layer;

(i) removing said exposed portions of said mask layer;

(j) isotropically etching said sacrificing layer using said unexposed portions, said first spacers and said barrier layer as stopping layers;

(k) forming a dielectric layer over said storage electrode; and (l) forming a second conductive layer as an opposite electrode over said dielectric layer thereby completing said capacitor.

13. The method for fabricating a cylindrical capacitor as claimed in claim 12, wherein said insulating layer includes at least one BPSG layer in which a bit line is formed.

14. The method for fabricating a cylindrical capacitor as claimed in claim 12, wherein said sacrificing layer is formed of silicon dioxide.

15. The method for fabricating a cylindrical capacitor as claimed in claim 14, wherein said barrier layer is formed of silicon nitride.

16. The method for fabricating a cylindrical capacitor as claimed in claim 15, wherein said mask layer is formed of silicon nitride.

17. The method for fabricating a cylindrical capacitor as claimed in claim 16, wherein said barrier layer has a thickness of about 300 Å, said sacrificing layer has a thickness of about 1000 Å, and said mask layer has a thickness of about 700 Å.

18. The method for fabricating a cylindrical capacitor as claimed in claim 15, wherein said first spacers are formed of silicon nitride.

19. The method for fabricating a cylindrical capacitor as claimed in claim 18, wherein said first spacers are formed by low-pressure chemical vapor deposition and have a width of about 300 Å.

20. The method for fabricating a cylindrical capacitor as claimed in claim 12, wherein said second spacers are formed of silicon nitride and have a width of about 300 Å.

21. The method for fabricating a cylindrical capacitor as claimed in claim 12, wherein said first conductive layer is formed by the following steps of:

forming a polysilicon plug in said contact hole to electrically connect to the source region; and forming a polysilicon layer over said polysilicon plug and said mask layer.

22. The method for fabricating a cylindrical capacitor as claimed in claim 12, wherein step (h) further comprises forming a plurality of hemispherical silicon grains over the exposed surface of said storage electrode.

23. The method for fabricating a cylindrical capacitor as claimed in claim 12, wherein said dielectric layer is formed of a material selected from the group consisting of silicon dioxide, silicon nitride, oxynitride, $Ta_2O_5$, and ferroelectric material.

* * * * *